(12) United States Patent
Paek

(10) Patent No.: US 6,740,950 B2
(45) Date of Patent: May 25, 2004

(54) OPTICAL DEVICE PACKAGES HAVING IMPROVED CONDUCTOR EFFICIENCY, OPTICAL COUPLING AND THERMAL TRANSFER

(75) Inventor: Jong Sik Paek, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 10/046,995

(22) Filed: Jan. 14, 2002

(65) Prior Publication Data
US 2002/0093078 A1 Jul. 18, 2002

(30) Foreign Application Priority Data

Jan. 15, 2001 (KR) .......................................... 2001-2161
Jan. 15, 2001 (KR) .......................................... 2001-2162
Feb. 12, 2001 (KR) .......................................... 2001-6823
Apr. 2, 2001 (KR) .......................................... 2001-17451

(51) Int. Cl.⁷ ..................... H01L 31/0232; H01L 23/02; H01L 21/00
(52) U.S. Cl. ....................... 257/433; 257/434; 257/435; 257/680; 257/737; 257/738; 438/48; 438/64; 438/65
(58) Field of Search ................................. 257/433, 680, 257/737, 738, 778, 779, 780, 215, 222, 291, 434, 435; 438/48, 64, 65

(56) References Cited
U.S. PATENT DOCUMENTS 5,521,429 A    5/1996   Aono et al.
5,867,368 A    2/1999   Glenn
5,949,655 A    9/1999   Glenn
5,950,074 A    9/1999   Glenn et al.
5,977,613 A   11/1999   Takata et al.
5,977,630 A   11/1999   Woodworth et al.
6,075,284 A    6/2000   Choi et al.
6,331,451 B1  12/2001   Fusaro et al.
6,342,406 B1 *  1/2002  Glenn et al. .................. 438/57
6,396,116 B1 *  5/2002  Kelly et al. .................. 257/432

* cited by examiner

Primary Examiner—Donghee Kang
(74) Attorney, Agent, or Firm—Weiss, Moy & Harris, P.C.

(57) ABSTRACT

An optical device package having improved conductor efficiency, optical coupling and thermal transfer, as well as various methods for packaging a semiconductor die provide reduced connection length, and improved optical and thermal characteristics. In one package, a conductive circuit pattern disposed on a transparent or translucent cover connects bond pads on the light receiving surface of the semiconductor die to external electrical contacts. The construction of the package reduces connection length and eliminates the air gap between the glass and the die.

In another package, a substrate having a protruding wall supports the glass and the substrate provides an electrical connection to terminals for connection to an external device.

In another package, the glass is supported by a die mounting board that supports the semiconductor die and includes leads for connection to an external device.

In other packages, the glass is supported directly by the semiconductor die and the die is supported by an encapsulated assembly including leads that support the semiconductor die.

18 Claims, 16 Drawing Sheets

OPTICAL DEVICE PACKAGES HAVING IMPROVED CONDUCTOR EFFICIENCY, OPTICAL COUPLING AND THERMAL TRANSFER

FIELD OF THE INVENTION

The present invention relates generally to integrated circuit packaging and more specifically, to a method and assembly for packaging an integrated circuit.

BACKGROUND OF THE INVENTION

Semiconductor dies for solid state image sensing devices are constructed so that a photoelectric conversion device and a charge coupled device thereof sense an image of a subject. (Reference to "semiconductor die" hereinafter will be understood to refer to a semiconductor die for a solid state sensing device.) The image is converted into an electrical signal for output from the image sensing device. The semiconductor die is generally used in an imaging device combined with a high capacity memory and an analog signal processing system.

In a semiconductor die, wire bonding processing is typically performed after the semiconductor die is bonded to a top surface of a substrate and then a transparent glass (or a translucent glass) is located on a top surface of the semiconductor die so that the semiconductor die may receive light from outside of the package.

However, conventional semiconductor packages made larger and have reduced electrical efficiency due to long signal lines between the semiconductor die and the substrate. In the typical semiconductor package, the semiconductor die and the substrate are electrically connected by wire having a predetermined loop height.

Also, because a gap exists between the semiconductor die and the glass, the image received in the semiconductor die is distorted through the glass.

Finally, as the bottom surface of the semiconductor die is bonded directly to the substrate, heat transfer from the semiconductor die is restricted.

Therefore, it would be desirable to provide a semiconductor die and method for packaging a semiconductor die that do not require lengthy wire bonds, eliminate the gap between the glass and the die, and improve heat transfer between the die and the substrate.

SUMMARY OF THE INVENTION

The above stated objectives are achieved in various assemblies and methods for packaging a semiconductor die. The die has a light receiving surface with multiple bond pads, at the periphery of the light receiving surface and a transparent or translucent glass mounted above the light receiving surface.

In some embodiments, conductors are disposed on the glass or in channels within the glass, providing an electrical connection to terminals for connection to an external device.

In other embodiments, conductors are provided on a substrate that has a protruding wall to support the glass, the substrate providing an electrical connection to terminals for connection to an external device.

In other embodiments, the glass is supported by a die mounting board that supports the semiconductor die and includes leads for connection to an external device.

In other embodiments, the glass is supported directly by the semiconductor die and the die is supported by an encapsulated assembly including leads that support the semiconductor die.

BRIEF DESCRIPTION OF THE DRAWINGS

The invention, as well as a preferred mode of use and advantages thereof, will best be understood by reference to the following detailed description of illustrative embodiments when read in conjunction with the accompanying drawings, wherein like reference numerals indicate like parts throughout.

DETAILED DESCRIPTION

Figure 1:
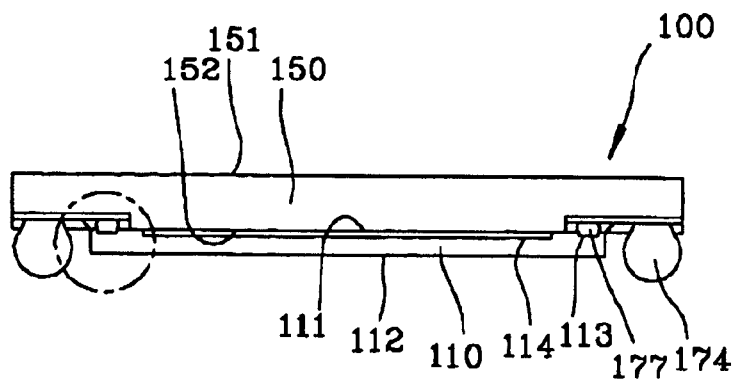
FIG. 1 is a sectional view illustrating a semiconductor package according to an embodiment of the present invention.
Figure 1A:
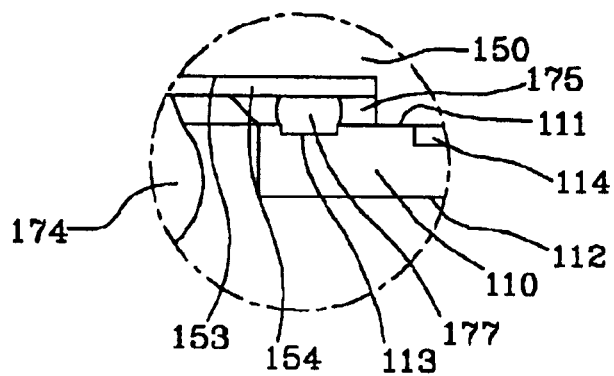
FIG. 1A is an exploded view of one portion of FIG. 1.
Figure 1B:
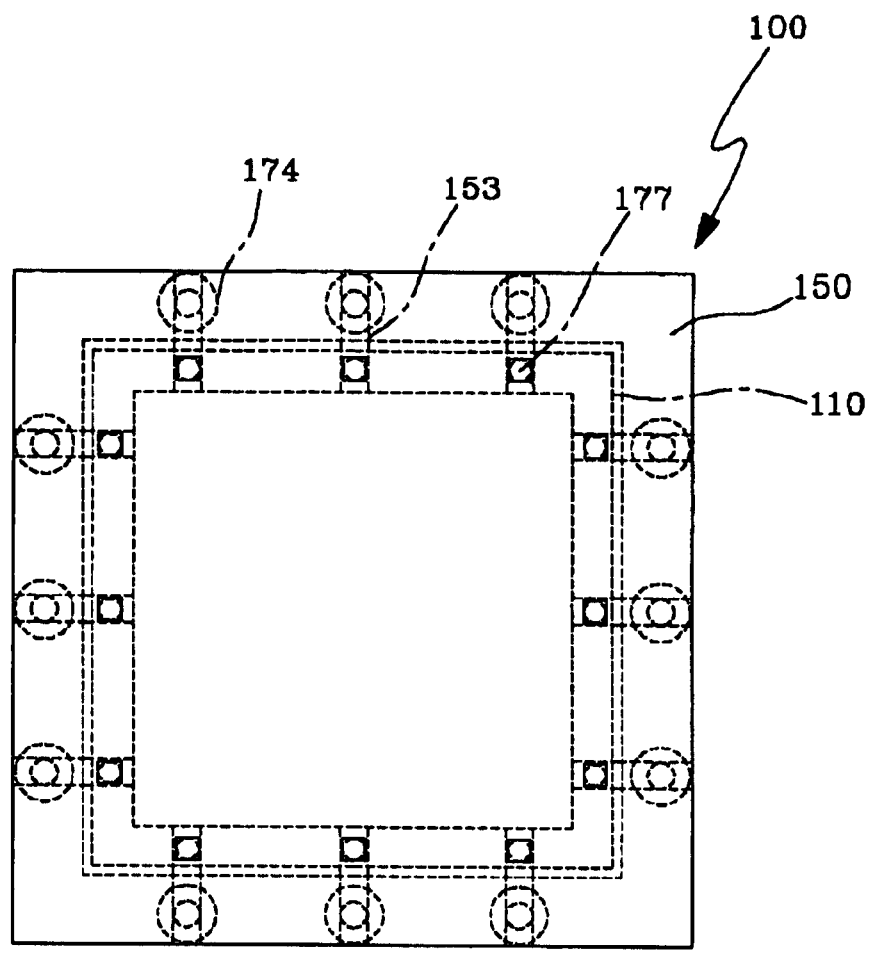
FIG. 1B is a plan view illustrating connection between the semiconductor die of FIG. 1 and a glass.

Referring to FIGS. 1, 1A and 1B, a semiconductor package 100 according to an embodiment of the present invention is illustrated. As shown in the drawings, a semiconductor die 110 having first and second surfaces 111 and 112, which are approximately planar surfaces, is provided. A light receiving surface 114, which receives a light from the outside (a predetermined image), is formed on first surface 111 of semiconductor die 110. A plurality of bond pads 113 are formed on the periphery of the light receiving surface 114.

Semiconductor die 110 can be manufactured to a predetermined thickness. One method of determining the thickness of the semiconductor die 110 is to grind the second surface 112, before the semiconductor die 110 is singulated from a wafer.

A plurality of conductive bumps 177 having a predetermined diameter are fused to bond pads 113. Conductive bumps 177 are formed from an electrically conductive substance such as gold (Au), silver (Ag), solder (Sn/Pb) or its equivalent. Any suitable conductive material for forming bumps 177 may be used in accordance with the present invention.

A glass 150 is coupled to light receiving surface 114. Glass 150 is coupled to first surface 111 of semiconductor die 110 to protect light receiving surface 114 from the external environment. Glass 150 is transparent so that outside light may reach light receiving surface 114.

Glass 150 has a first surface 151 and a second surface 152 that are approximately planar. Both surfaces 151 and 152 are larger than semiconductor die 110. Second surface 152 is coupled to light receiving surface 114. A plurality of channels 153 are formed at the circumference of second surface 152. Channels 153 may be formed by conventional methods such as engraving or etching. Electrically conductive patterns 154 are formed in each of channels 153. The material of the electrically conductive patterns may be any one of the copper (Cu), aluminum (Al) or its equivalent. Any suitable conductive material may be used to form electrically conductive patterns 154 within the present embodiment.

Conductive bumps 177, which are fused to each of bond pads 113, are electrically connected to electrically conductive patterns 154. Conductive bumps 177 are covered with an underfill 175 at the periphery of glass 153, so that extraneous substances can not reach light receiving surface 114.

A plurality of conductive balls 174, which have a diameter that is generally larger than the thickness of the semiconductor die 110, are fused to each of electrically conductive patterns 154 which are located at the periphery of the glass 150. Conductive balls 174 may be selected from any type of conductive material such as a solder ball, solder pad, liquefied solder paste or its equivalent. Conductive balls 174 serve to connect the semiconductor package 100 to an external device (not shown) such as a motherboard.

An insulating cover coat (not shown) may be applied to electrically conductive patterns 154 except in the regions that conductive balls 174 and conductive bumps 177 connect. Electrically conductive patterns 154 can be more positively protected from the external environment by applying a cover coat as described above. Conductive balls 174 may be fused to an external device rather than to electrically conductive patterns 154. Semiconductor package 100 (without conductive balls 174) is coupled to the external device by means of the conductive balls on the external device.

In semiconductor package 100, an optical image, which passes to through glass 150, is converted into electrical signals by means of semiconductor die 110. The converted electrical signals are transmitted to the external device from bond pads 113 through conductive bumps 177, electrically conductive patterns 154 and conductive balls 174.

Therefore, this embodiment of the present invention provides a thin and small semiconductor package 100 by directly forming electrically conductive patterns 154 on glass 150, and by electrically connecting semiconductor die 110 to electrically conductive patterns 154 in the form of a flip die. Light receiving surface 114 of the semiconductor die 10 is directly coupled to the glass 150, thereby minimizing the potential of distortion of the image signal of light received from the outside. Second surface 112 of semiconductor die 110 may either be exposed to the external air or coupled to the external device. First surface 111 of semiconductor die 110 is coupled to glass 150, which provides for excellent thermal conductivity.

FIGS. 2A through 2G are cross-sectional views illustrating a method for manufacturing the semiconductor package of FIGS. 1, 1A and 1B. The method according to this embodiment of the present invention will be described in a stepwise manner with reference to FIGS. 2A through 2G.

First, semiconductor die 110 is formed with first and second surfaces 111 and 112, which are approximately planar surfaces. Light receiving surface 114, is formed on first surface 111 of semiconductor die 110. The plurality of bond pads 113 are then formed on the periphery of the light receiving surface 114.

Figure 2A:
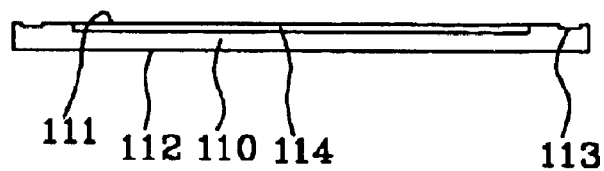
FIG. 2A through FIG. 2G are cross-sectional views for explaining a method for manufacturing the semiconductor package of FIG. 1.
Figure 2B:
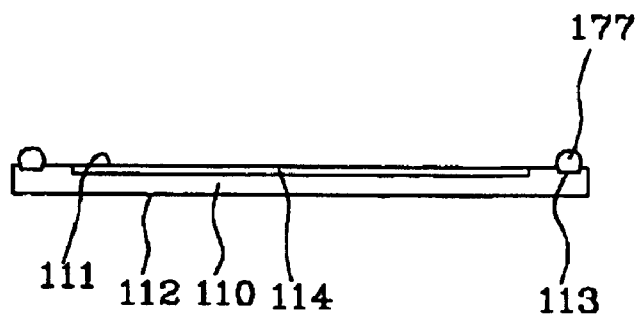

Referring to FIG. 2B, conductive bumps 177 are fused to bond pads 113. In the illustrated embodiment, conductive bumps 177 have a predetermined diameter.

Figure 2C:
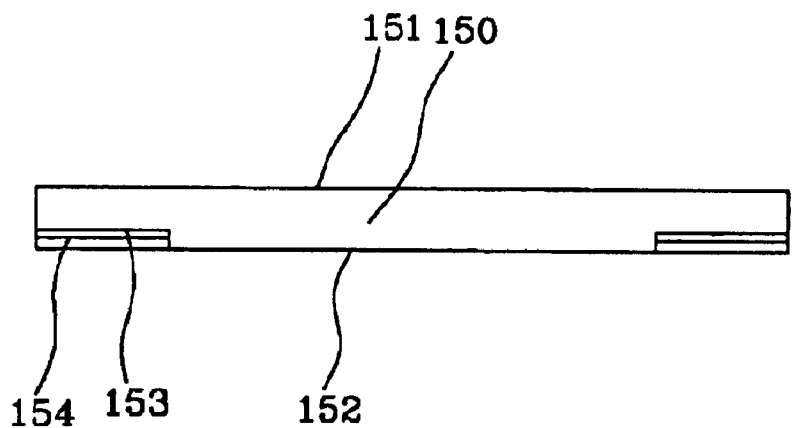

Referring to FIG. 2C, glass 150 is formed having first and second surfaces 151 and 152, which are approximately planar surfaces. Channels 153 are formed at the periphery of the second surface 152 by a variety of methods known to those skilled in the art. Electrically conductive patterns 154 are then formed in channels 153. In the illustrative embodiment, the lateral dimensions of glass 150 are greater than those of semiconductor die 110.

Electrically conductive patterns 154 are formed by using a conductive metal such as aluminum (Al), copper (Cu) or its equivalent. In addition, the electrically conductive patterns 154 can be formed by a variety of methods such as coating, sputtering and evaporating or their equivalent. In an alternative embodiment, no channels are formed on second surface 152 of glass 150. In this alternative embodiment, electrically conductive patterns 154 are formed directly on second surface 152. Thus, a lower surface of electrically conductive patterns 154 protrudes from second surface 152. The steps illustrated in FIGS. 2A–B are independent of the steps illustrated by FIG. 2C.

Figure 2D:
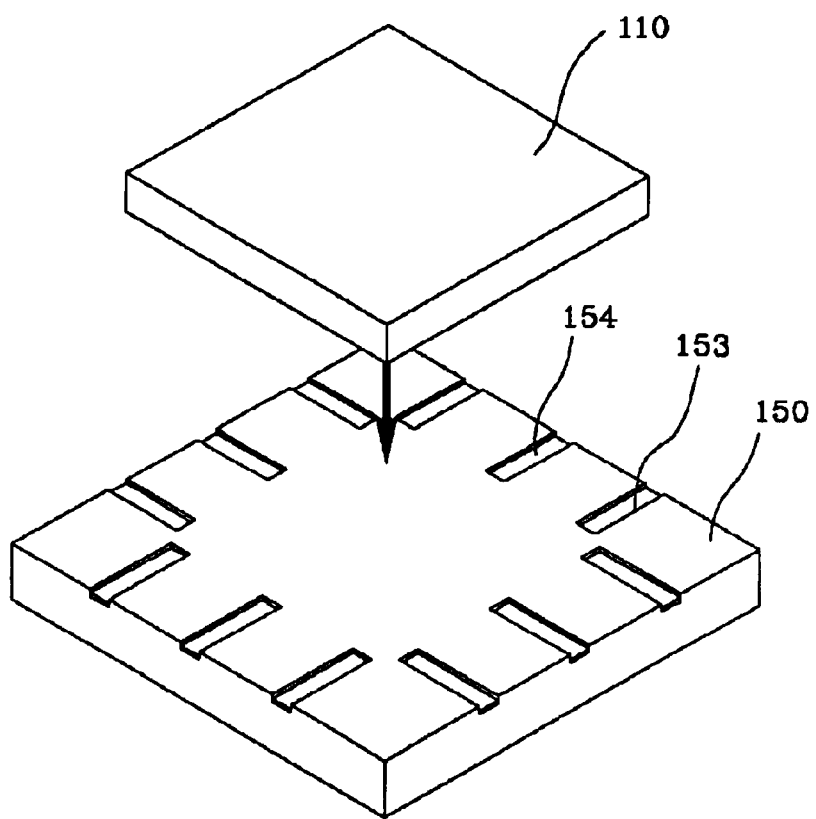

Referring to FIG. 2D, the relative position of semiconductor die 110 with respect to that of glass 150 is shown. Also illustrated are electrically conductive patterns 154 within channels 153.

Figure 2E:
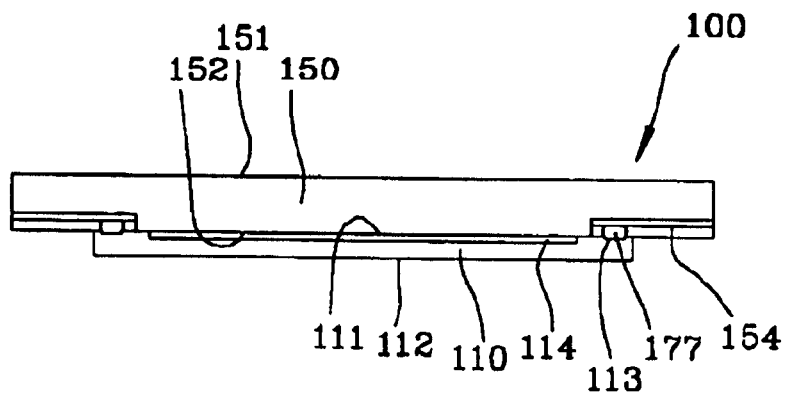

Referring to FIG. 2E, semiconductor die 110 is coupled to glass 150. Conductive bumps 177, which are formed on bond pads 113 of semiconductor die 110, are connected to electrically conductive patterns 154 of glass 150. That is, electrically conductive patterns 154 and bond pads 113 of semiconductor package 100 are mechanically and electrically connected to each other by melting conductive bumps 177 at a high temperature. As conductive bumps 177 melt, they spread along electrically conductive patterns 154, thereby more securely coupling light receiving surface 114 to second surface 152.

Figure 2F:
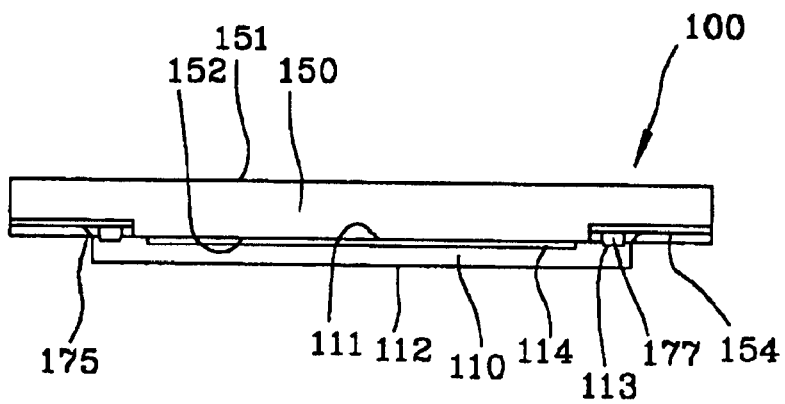

Referring to FIG. 2F, in a subsequent step, underfill 175 is introduced into the periphery of conductive bumps 177, thereby protecting conductive bumps 177 from external environment. Underfill 175 includes particles having a diameter slightly larger than the distance between light receiving surface 114 of semiconductor die 110 and second surface 152 of glass 150. Therefore, underfill 175 does not penetrate the gap between light receiving surface 114 and second surface 152. (Light receiving surface 114 of semiconductor die 110 will not be contaminated with underfill 175).

Figure 2G:
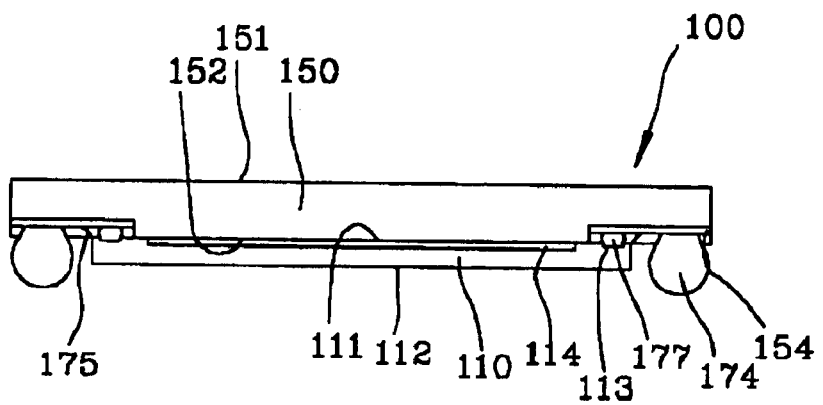

Referring to FIG. 2G, conductive balls 174 are fused to electrically conductive patterns 154, which are located at the periphery of semiconductor die 110. A flux (not shown) is applied to electrically conductive patterns 154 within glass 150. Conductive balls 174 provisionally adhere to the flux until the device is subject to high temperature at which point conductive balls 174 fuse to electrically conductive patterns 154. Alternatively, a solder paste may be applied to electrically conductive patterns 154 in place of the flux, and then the solder paste can be fused to the electrically conductive patterns 154 under high temperature conditions thereby forming a solder ball or solder pad.

In an alternative embodiment, conductive balls are formed on an external device in lieu of forming conductive balls 174 on semiconductor package 100. In the above-mentioned alternative, conductive balls 174 will be not formed on the electrically conductive patterns 154 as explained above.

Figure 3:
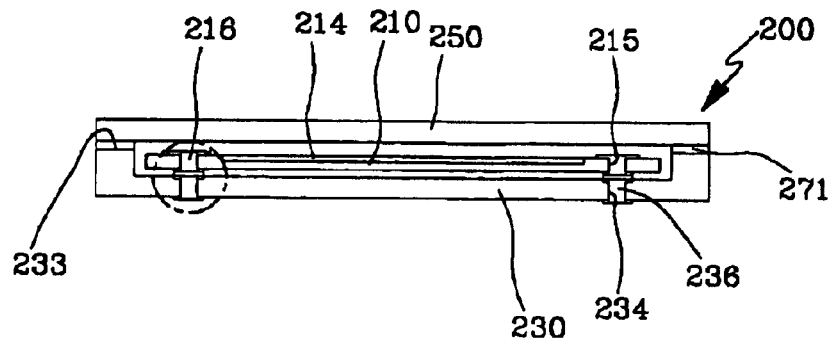
FIG. 3 is a sectional view illustrating a semiconductor package according to another embodiment of the present invention.
Figure 3A:
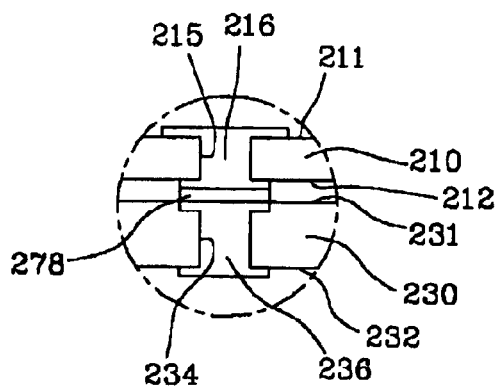
FIG. 3A is a exploded view of one portion of FIG. 3.
Figure 3B:
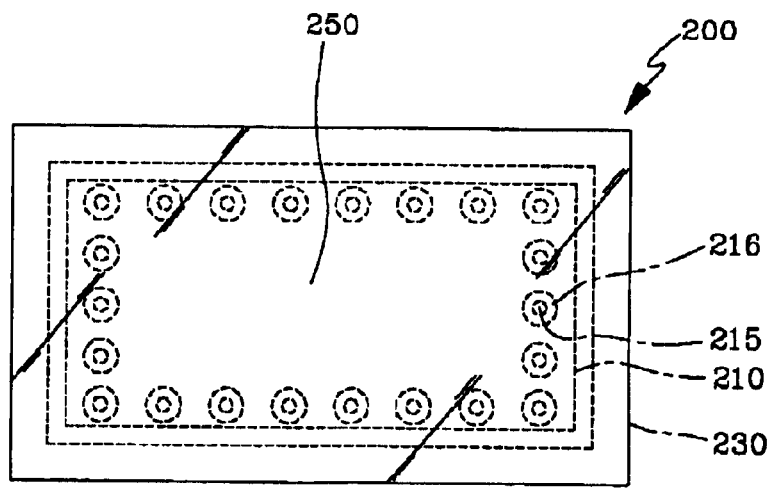
FIG. 3B is a plan view illustrating connection between the semiconductor die of FIG. 3 and a substrate.

Referring to FIGS. 3, 3A and 3B, a semiconductor package 200 according to another embodiment of the present invention is illustrated. As shown in the drawings, a semiconductor die 210 having first and second surfaces 211 and 212, which are approximately planar surfaces, are provided. A light receiving surface 214, which receives a light from the outside (a predetermined image), is formed on first surface 211 of semiconductor die 210. A plurality of bond pads (not shown) are formed on the periphery of light receiving surface 214.

A die via hole 215 having a predetermined diameter is perpendicularly formed proximate to the bond pads of semiconductor die 210 by means of conventional methods such as chemical etching or laser. A die conductive via 216 is formed inside die via hole 215 by applying a conductive metal such as aluminum, copper, gold, silver or its equivalent. In an alternative embodiment, the walls of die via hole 215 can be plated.

Die conductive via 216 can overflow die via hole 215, on to first and second surfaces 211 and 212 of semiconductor die 210, forming segments or protrusions that extend beyond the circumference of the die via hole 215 onto first and second surfaces 211 and 212. Such overflow of the die conductive via 216 may improve the electrical connection between die conductive via 216 and a substrate 230 as described below. This feature can be equally applied to all embodiments of the present invention using die conductive via 216 as described below.

First surface 211 of semiconductor die 210 can be electrically connected to second surface 212 through die conductive via 216. The bond pads of first surface 211 can thereby be electrically connected to second surface 212.

Substrate 230, which has lateral dimensions which are greater than those of semiconductor die 210, is formed in the proximity of second surface 212, and includes a first surface 231 and a second surface 232 that are approximately planar surfaces. A substrate via hole 234, having a predetermined diameter, is formed in a region of substrate 230 which corresponds to die via hole 215. A substrate conductive via 236 is formed in substrate via hole 234. The structure and method for forming the substrate conductive via 236 is similar to those for die conductive via 216 as described above.

A conductive connector 278 may also be formed between die conductive via 216 and substrate conductive via 236 to provide an electrical connection between them. Conductive connector 278 may be a conductive material such as solder ball, solder paste, conductive adhesive or its equivalent. Therefore, the bond pads of semiconductor die 210 can be electrically connected to second surface 232 of the substrate 230 by die conductive via 216, conductive connector 278 and substrate conductive via 236.

Substrate 230 includes a third surface 233, which is approximately planar and parallel to first and second surfaces 231 and 232. The third surface 233 upwardly protrudes from first surface 231 of substrate 230 at the periphery of the substrate 230. The thickness between second surface 232 and third surface 233 is greater than that between the first surface 231 and the second surface 232. The thickness between or distance between first surface 231 and third surface 233 is approximately equal to the thickness of semiconductor die 210, i.e., the distance between first surface 211 and second surface 212.

A glass 250 is attached to third surface 233 of substrate 230 by an attach material 271 such as epoxy, adhesive or its equivalent, in order to allow light receiving surface 214 to receive a light from the outside and protect semiconductor die 210 from external environment. Alternatively, glass 250 can be attached to a top surface of die conductive via 216 by a variety of means including attach material (not shown).

Here, substrate 230 may be any one of thermosetting resin, ceramics or its equivalent and the present invention is not limited by a material of substrate 230.

In the case that the ceramics is used as the substrate, the resistance of the ceramic to water is high, resulting in high reliance of the package. Also, it can minimize a thermal stress owing to a similarity in the coefficient of thermal expansion in between the semiconductor die, which is usually made from silicon, and the substrate, which is made from ceramics.

Substrate conductive via 236 formed in the substrate via hole 234 is downwardly extended from the second surface 232 of the substrate 230. Therefore, the substrate conductive via 236 extended from the second surface 232 of the substrate 230 is connected to an external device later.

In an alternative embodiment, the substrate conductive via 236 exposed to or extended from the second surface 232 of the substrate 230 can be formed in a land grid array (LGA) type (not shown). Namely, a plurality of metal lines connected to the substrate conductive via 236 can be formed on the second surface 232 of the substrate 230 and a plurality of lands can be formed on the metal lines in an array type.

In an alternative embodiment, external terminals can be fused to the substrate conductive via 236, which is exposed to or extended from the second surface 232 or the lands (not shown). That is, the external terminals may be any one of the solder ball, solder pad, solder paste or its equivalent.

In the semiconductor package 200 according to another embodiment of the present invention as described above, an image embodied in a light signal, which passes through the glass 250, is converted into an electrical signal by means of the semiconductor die 210. The converted electrical signal is transmitted to the external device from the bond pads (not shown) through the die conductive vias 216 (which are formed in die via hole 215 of semiconductor die 210) to conductive connector 278 and to substrate conductive via 236 formed in substrate via hole 234.

Namely, the semiconductor package 200 includes die via holes 215 and substrate via holes 234 formed in semiconductor die, 210 and substrate 230 respectively, die conductive vias 216 and substrate conductive vias 236 are connected to die via holes 215 and substrate via holes 234, and connector 278 connects semiconductor die 210 to substrate 230.

Semiconductor package 200 thereby has reduced thickness and improved electrical efficiency. Also, semiconductor package 200 has enhanced resistance to water and considerably alleviates thermal stress by using a ceramic substrate.

The method for fabricating semiconductor packages according to another embodiment of the present invention as described above will now be described.

First, semiconductor die 210 having first and second surfaces 211 and 212, which are approximately a planar surface, with light receiving surface 214 formed on the first surface 211 and a plurality of bond pads formed on the periphery of light receiving surface 214 is provided.

Die via hole 215 having a predetermined diameter is formed within the bond pads of the semiconductor die 210 by means of a conventional method such as etching, laser or its equivalent. Die conductive via 216 is formed inside die via hole 215 in order to electrically connect the bond pads to second surface 212.

Substrate 230, which has lateral dimensions which are greater than those of the semiconductor die 210 and formed at a region corresponding to second surface 212 of semiconductor die 210 is provided. Substrate 230 includes first and second surfaces 231 and 232, which are approximately planar surfaces, and third approximately planar surface 233, which upwardly protrudes from the edge of first surface 231. Also, substrate via holes 234 are formed at a region corresponding to the bond pads of semiconductor die 210 and substrate conductive via 236 is formed within substrate via holes 234 for connection to an external device.

Die conductive vias 216 formed in the die via holes 215 are electrically connected to substrate conductive vias 236 formed in substrate via holes 234 of substrate 230 using conductive connector 278. Then, glass 250 is attached to third surface 233 by means of attach material 271. External terminals, formed by solder balls, solder pads, solder paste or an equivalent are further formed on substrate conductive via 236 exposed to or extended from second surface 232.

Figure 4:
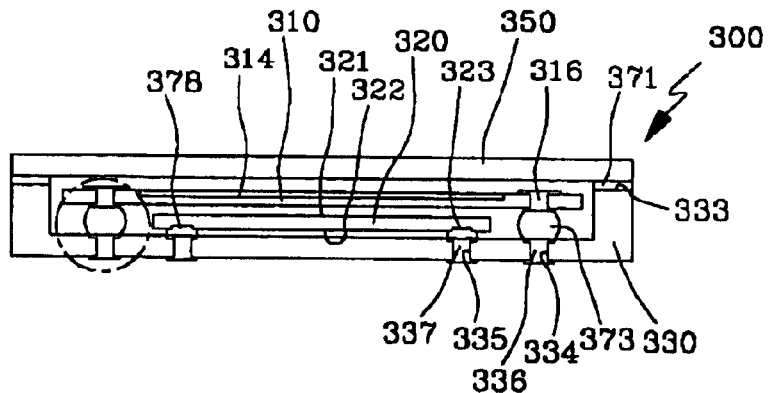
FIG. 4 is a sectional view illustrating a semiconductor package according to another embodiment of the present invention.
Figure 4A:
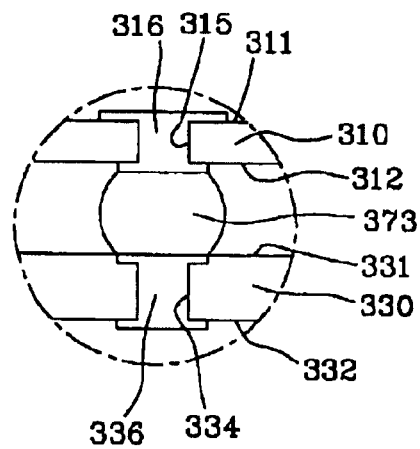
FIG. 4A is a exploded view of one portion of FIG. 4.
Figure 4B:
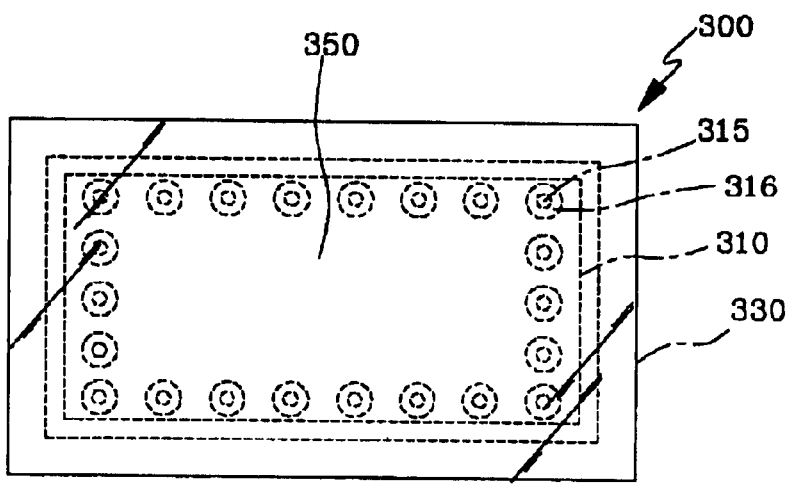
FIG. 4B is a plan view illustrating a connection between the semiconductor die of FIG. 4A and a substrate.

Referring to FIGS. 4, 4A and 4B, a semiconductor package 300 according to a another embodiment of the present invention is illustrated.

As shown in the drawings, a first semiconductor die 310 having first a first surface 311 and a second surface 312, which are substantially planar surfaces, is provided. A light receiving surface 314, which receives a light from the outside (a predetermined image), is formed on first surface 311 of first semiconductor die 310. A plurality of bond pads (not shown) are formed on the periphery of light receiving surface 314.

A die via hole 315 having a predetermined diameter is perpendicularly formed in the bond pads of first semiconductor die 310 by means of conventional methods such as chemical etching, laser or equivalent. A die conductive via 316 is formed within die via hole 315. Therefore, first surface 311 can be electrically connected to second surface 312 through die conductive via 316.

Die conductive via 316 can be further extended along the periphery of the entrance of die via hole 315, which passes through first and second surfaces 311 and 312 to the outside, thereby improving the electrical connection between die conductive via 316 and a substrate 330 described below.

A second semiconductor die 320 having another function and a breadth which is smaller than that of first semiconductor die 310 is located at the bottom surface of second surface 312. Second semiconductor die 320 includes a first surface 321 and a second surface 322, and a plurality of bond pads 323 are formed on second surface 322.

Substrate 330, which has lateral dimensions which are greater than those of the first semiconductor die 310 and formed at second surface 322 of the second semiconductor die 320 is provided. Substrate 330 includes a first surface 331 and a second surfaces 332, which are substantially planar surfaces.

Substrate 330 also includes a first substrate via hole 334 formed at a region corresponding to die via hole 315 and a second substrate via hole 335 formed at a region corresponding to bond pads 323.

A first substrate conductive via 336 and a second substrate conductive via 337 are formed in first and second substrate via holes 334 and 335 of the substrate 330, respectively. A conductive ball 373 is formed between die conductive via 316 and first substrate conductive via 336 to electrically connect first semiconductor die 310 to substrate 330. A conductive connector 378 is formed between bond pads 323 of second semiconductor die 320 and second substrate conductive via 337 to electrically connect the second semiconductor die 320 to the substrate 330.

In an alternative embodiment, conductive ball 373 is a conductive bump or conductive solder ball having a size large enough to place first semiconductor die 310 on first surface 321 of second semiconductor die 320. The conductive bump or conductive solder ball may be a solder bump, solder pad, solder ball or an equivalent. Conductive connector 378 may be conductive adhesive, gold, silver, solder, solder paste or an equivalent. First semiconductor die 310 is thereby electrically connected to second surface 332 of substrate 330 through die conductive via 316, conductive ball 373 and first substrate conductive via 336. Second semiconductor die 320 is electrically connected to second surface 332 of substrate 330 through bond pads 323, conductive connector 378 and a conductive ball formed in second substrate via hole 335 of the substrate 330.

Substrate 330 includes a third approximately planar surface 333 having a height above that of first surface 331. The thickness between first surface 331 and third surface 333 is greater than that between first surface 331 and second surface 332.

A glass 350 is attached to third surface 333 of substrate 330 by means of an attach material 371. Glass 350 allows light receiving surface 314 of first semiconductor die 310 to receive light from the outside and protect first semiconductor die 310 and second semiconductor die 320 from the external environment.

In an alternative embodiment, external terminals can be fused to first substrate conductive via 336 and second substrate conductive via 337, which are exposed to or extended from second surface 332 as described above. Also, the external terminals may be a solder ball, solder pad, solder paste or an equivalent.

In an alternative embodiment, an image contained in a light signal passes through the glass 350 and is converted into an electrical signal by means of first semiconductor die 310. The converted electrical signal is transmitted to the external device through the die conductive via 316 formed in die via hole 315 of first semiconductor die 310, conductive connector 378 and first substrate conductive via 336 (and/or external terminal) formed in via hole 334 of substrate 330.

A signal of second semiconductor die 320 is transmitted to an external device through second substrate conductive via 337, depending on the function of second semiconductor die 320. For example, second semiconductor die 320 may be a memory for memorizing sensed image information from first semiconductor die 310. Light is thereby converted into a predetermined image for output to first semiconductor die 310 and second semiconductor die 320 then memorizes the image information provided by first semiconductor die 310, resulting in a multi-function of the semiconductor package. Moreover, when ceramics are used for substrate 330, they can enhance the resistance to water and considerably alleviate thermal stress.

A method for fabricating semiconductor package 300 according to another embodiment of the present invention as described above will now be described.

First semiconductor die 310 having substantially planar first and second surfaces 311 and 312, light receiving surface 314 formed on first surface 311, and a plurality of bond pads formed on the periphery of light receiving surface 314, is provided.

First semiconductor die 10 includes die via holes 315 formed by punching the bond pads. Die conductive vias 316 are formed in die via holes 315 in order to electrically connect the bond pads to second surface 312 of first semiconductor die 310.

Second semiconductor die 320 having approximately planar first and second surfaces 321 and 322, and a plurality of bond pads 323 formed on second surface 322, is provided.

Substrate 330 includes substantially planar first and second surfaces 331 and 332, and a substantially planar third surface 333 upwardly protruded from the edge of first surface 331. First and second substrate via holes 334 and 335 are formed at regions corresponding to die conductive via 316 and bond pads 323 of second semiconductor die 320, respectively. The first and second substrate conductive vias 336 and 337 are formed within first and second substrate via holes 334 and 335, respectively.

Bond pads 323 of the second semiconductor die 320 are electrically connected to second substrate conductive via 337 using conductive connector 378. Die conductive via 316 of first semiconductor die 310 is electrically connected to first substrate via 336 using conductive ball 373. Then, a transparent glass 350 is attached to third surface 333 by means of attach material 371.

External terminals are further formed on first and second substrate conductive vias 336 and 337, which are exposed to or extended from second surface 332.

Figure 5:
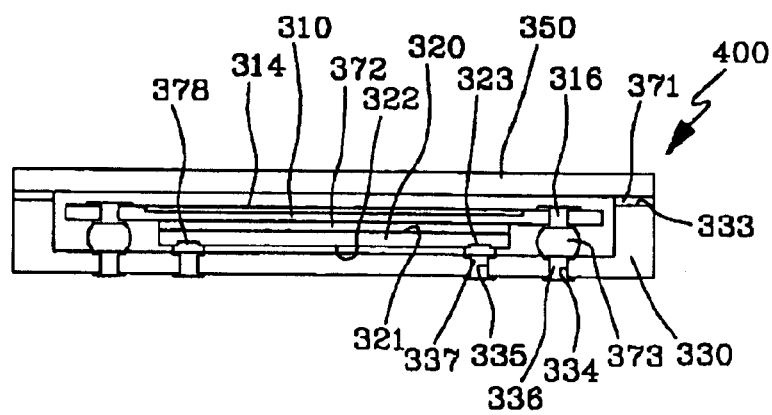
FIG. 5 is a sectional view illustrating a semiconductor package according to another embodiment of the present invention.
Figure 6:
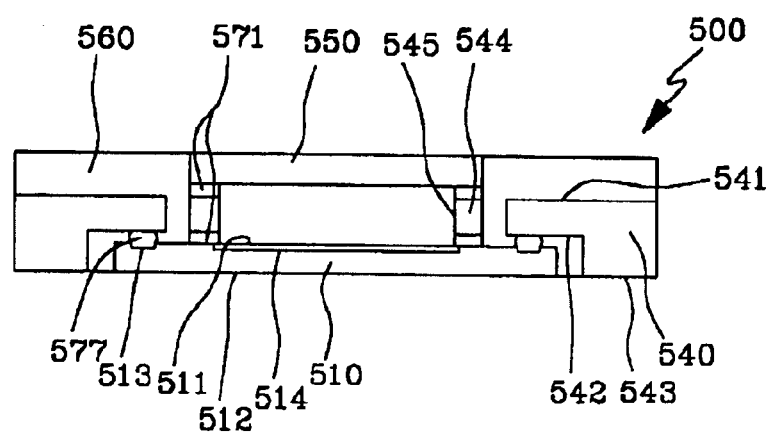
FIG. 6 is a sectional view illustrating a semiconductor package according to another embodiment of the present invention.
Figure 6A:
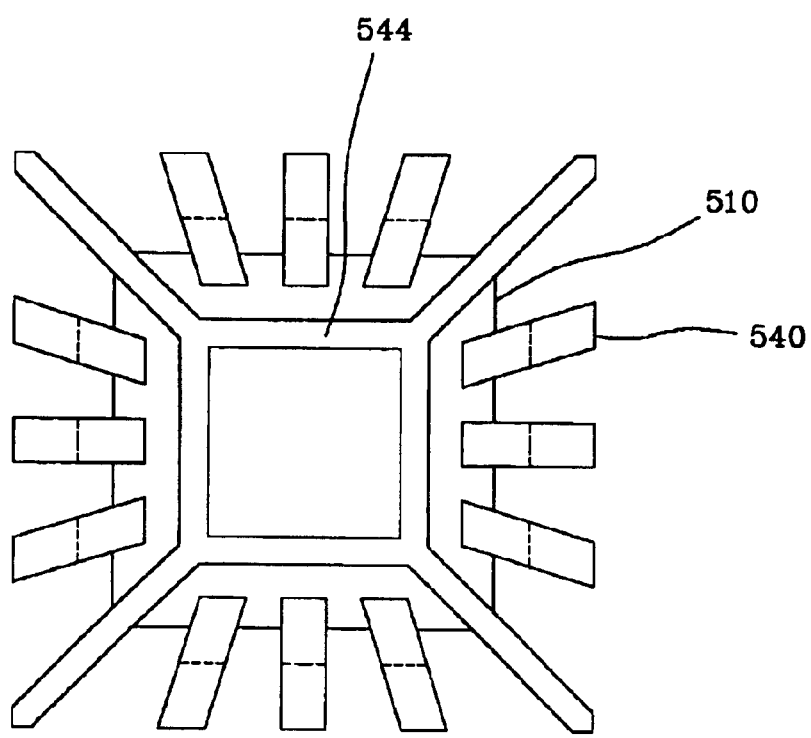
FIG. 6A is a plan view illustrating connection between the semiconductor die of FIG. 6 and a substrate.
Figure 6B:
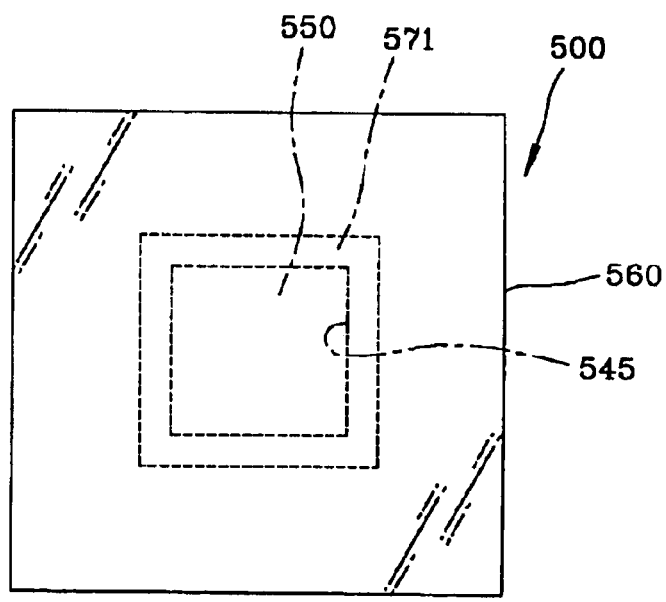
FIG. 6B is a plan view illustrating the semiconductor package of FIG. 6.
Figure 6C:
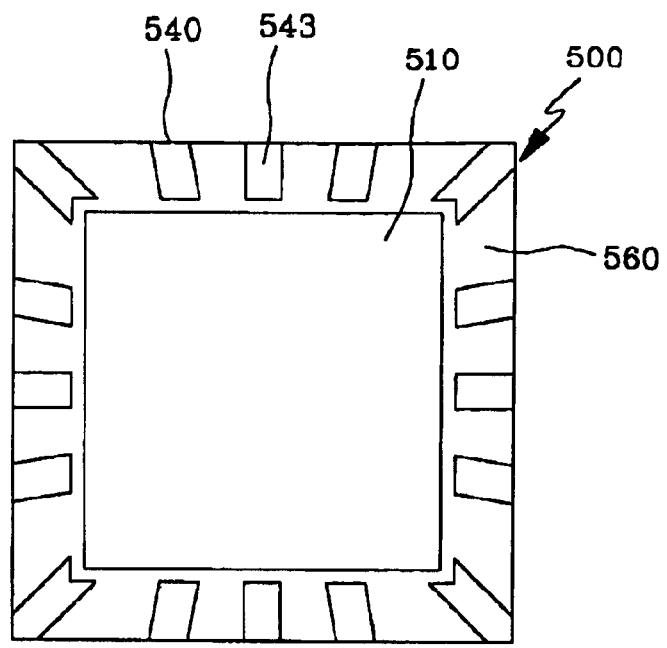
FIG. 6C is a bottom view illustrating the semiconductor package of FIG. 6.

In another embodiment of the present invention, a semiconductor package 400 is fabricated as shown in FIG. 5. After second semiconductor die 320 is mounted on substrate 330, first and second semiconductor dice 310 and 220 can be attached to each other by applying a die attach material 372 to first surface 321 of second semiconductor die 320. In this embodiment, first semiconductor die 310 is supported more stably.

Although a ceramic is used as the substrate in the method for fabricating the semiconductor package described above before, the substrate can be formed from a general thermosetting resin.

Referring to FIGS. 6, 6A, 6B and 6C, a semiconductor package 500 according to another embodiment of the present invention and connections between a semiconductor die and substrate are illustrated. As shown in the drawings, a semiconductor die 510 having a first surface 511 and a second surfaces 512, which are substantially planar, is provided. A light receiving surface 514, which receives light from the outside is formed on first surface 511 and a plurality of bond pads 513 are formed on the periphery of light receiving surface 514.

A die mounting board 544 having a plurality of leads 540 is located at a region extended from first surface 511 to the periphery of semiconductor die 510. Die mounting board 544 is an approximately planar plate having an aperture 545 formed at the center thereof. The plurality of leads 540 have first surfaces 541 and second surfaces 542, which are substantially planar surfaces, and are located at the periphery of die mounting board 544.

The materials of the die mounting board and leads may be any one of the copper, copper alloy, steel or an equivalent. The material may be equally applied to all embodiments of the present invention using leads, as described below.

Die mounting board 544 is attached to first surface 511 at the periphery of light receiving surface 514 by means of an attach material 571 such as epoxy, adhesive or its equivalent. Die mounting board 544 is attached to first surface 511 by an attach material 571 so that aperture 545 is placed above the entire light receiving surface 514.

The breadth of die mounting board 544 is less than that of first semiconductor die 510. Die mounting board 544 is constructed so that die mounting board 544 is located only inside of bond pads 513.

Leads 540 are located at bond pads 513 of semiconductor die 510. That is, second surface 542 of the leads 540 corresponds to the first surface 511 of the semiconductor die 510.

Conductive bumps 577 are fused between bond pads 513 and second surface 542 of leads 540, in order to electrically connect them.

Leads 540 include a third surface 543 formed at the periphery of the semiconductor die 510, and third surface 543 is thereby flush with second surface 512 of semiconductor die 510. Therefore, the thickness between first surface 541 and third surface 543 of leads 540 is thicker than the thickness between first surface 541 and second surface 542. Also, the thickness between second surface 542 and third surface 543 of leads 540 is approximately the thickness of semiconductor die 510 between first surface 511 and second surface 512.

A glass 550 is attached to die mounting board 544 by means of an attach material 571, in order to allow light receiving surface 514 of first semiconductor die 510 to easily receive light from the outside and protect light receiving surface 514 from the external environment.

Finally, glass 550, die mounting board 544, semiconductor die 510, conductive bumps 577 and leads 540 are encapsulated by an encapsulant 560. Encapsulant 560 does not reach light receiving surface 514 due to the presence of die mounting board 544, attach material 571 and glass 50.

Second surface 512 of semiconductor die 510 and third surface 543 of leads 540 are exposed to the outside of the encapsulant 560. Thus, in semiconductor package 500, heat generated from the semiconductor die 510 is be easily emitted to the outside, and third surface 543 of leads 540 is easily connected to an external device. As the top surface of the glass 550 is not covered by encapsulant 560, light from the outside is easily received by light receiving surface 514 through glass 550. In an alternative embodiment, second surface 512 of semiconductor die 510 can be encapsulated by an encapsulant (not shown), so that semiconductor die 510 can be more positively protected from the external environment.

Light that passes through glass 550 is received by light receiving surface 514 through aperture 545. An image signal from the light is converted into an electrical signal by means of semiconductor die 510. The converted electrical signal is transmitted to an external device through conductive bumps 577, leads 540 and third surface 543 of leads 540.

Therefore, the present invention provides a thin and small semiconductor package 500 by connecting semiconductor die 510 to leads 540 in the form of a flip die and by allowing the second surfaces 542 of leads 540, on which the semiconductor die 510 is mounted, to be made thin.

Second surface 512 of semiconductor die 510 is exposed to the outside of the encapsulant 560, whereby the heat generated from semiconductor die 510 can be easily emitted to the outside.

A method for fabricating semiconductor packages 500 according to another embodiment of the present invention as described above will be described hereinafter.

First, die mounting board 544 is provided. Leads 540 having first, second and third surfaces 541, 542 and 543, are located at periphery of die mounting board 544. Die mounting board 544 has the same thickness as that between first surface 541 and second surface 542. Semiconductor die 510 is placed on the second surfaces 542 of each of leads 540 and die mounting board 544. Bond pads 513 are formed on the periphery of light receiving surface 514. First surface 511 and light receiving surface 514 of the semiconductor die 510 are opposite to the leads 540 and the die mounting board 544.

Conductive bumps 577 are applied to bond pads 513 in order to electrically connect to leads 540. The material of conductive bumps 577 may be any one of the gold (Au), silver (Ag), solder or an equivalent. The semiconductor die 510 can be easily mounted on die mounting board 544 by applying attach material 571 to one side of die mounting board 544.

In this embodiment, conductive bumps 577 are formed on semiconductor die 510 in advance, which is not a limitation of the present invention. In an alternative embodiment, the conductive bumps 577 may be formed on the leads 540 in advance of assembly.

After semiconductor die 510 is attached to die mounting board 544 as described above, the combined assembly is loaded into a high temperature furnace in order to melt conductive bumps 577, whereby leads 540 and semiconductor die 510 are mechanically and electrically connected to each other. Then, glass 550 is attached to another surface of die mounting board 544 by means of attach material 571. Next, semiconductor die 510 is encapsulated by encapsulant 560 in order to protect semiconductor die 510 from the external environment.

Third surface 543 of leads 540 is exposed to the outside of encapsulant 560, whereby leads 540 can be easily connected to an external device. Second surface 512 of semiconductor die 510 is also exposed to the outside of encapsulant 560, permitting heat generated from the semiconductor die 510 to be easily emitted to the outside. The top surface of the glass 550 is not encapsulated by encapsulant 560, so that light from the outside is easily received at light receiving surface 514 through glass 550.

Figure 7:
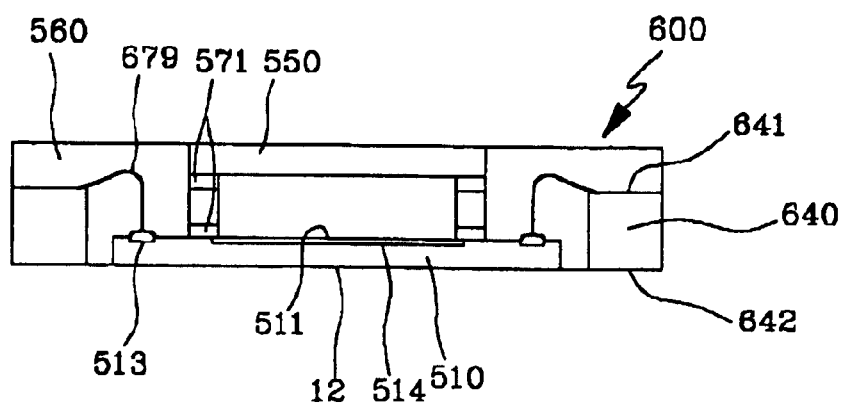
FIG. 7 is a sectional view illustrating a semiconductor package according to another embodiment of the present invention.
Figure 7A:
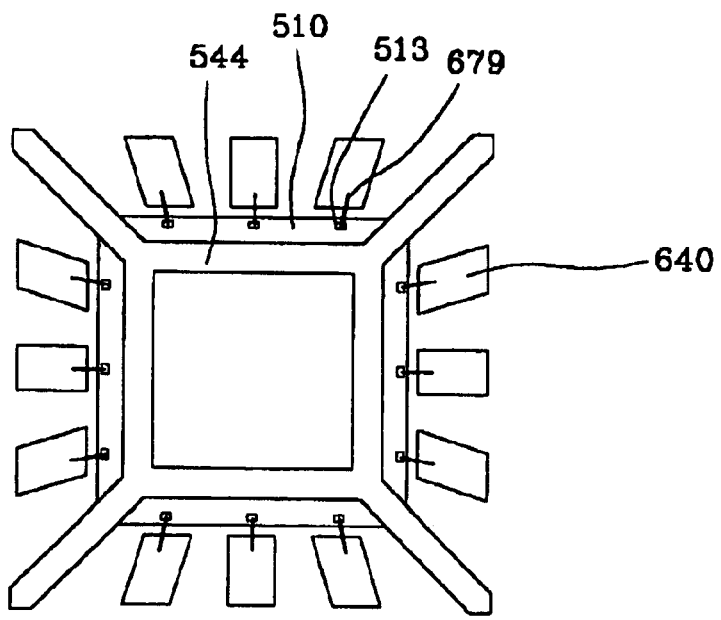
FIG. 7A is a plan view illustrating connection between the semiconductor die of FIG. 7 and a substrate.

Referring to FIGS. 7 and 7A, a semiconductor package 600 according to a another embodiment of the present invention is illustrated.

Since semiconductor package 600 and semiconductor package 500 can be constructed in a similar fashion, only differences will be described below.

As shown in the drawings, leads 640 having substantially planar first and second surfaces 641 and 642, are located at the periphery of semiconductor die 510. First surface 641 of leads 640 are electrically connected to bond pads 513 of semiconductor die 510 by means of conductive wires 679. Second surface 642 of leads 640 is flush with second surface 512 of semiconductor die 510. Thereby, second surface 642 of leads 640 may be connected to an external device.

Within semiconductor package 600, semiconductor die 510 is attached to die mounting board 544, in which aperture 545 is formed at the center thereof. Then, semiconductor die 510 and each of leads 640 are electrically connected to each other by bonding them with conductive wires 679. In succession, a glass 550 is attached to the other surface of die mounting board 544 by means of attach material 571. Then, semiconductor die 510 is encapsulated by an encapsulant 560 in order to protect semiconductor die 510 from the external environment.

Figure 8:
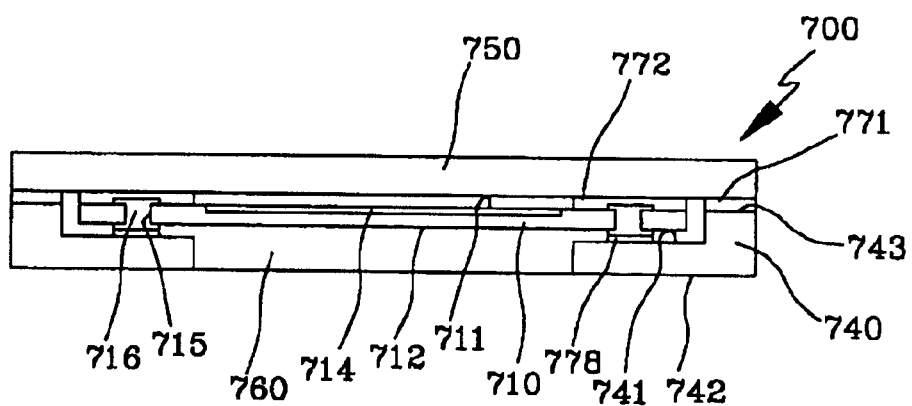
FIG. 8 is a sectional view illustrating a semiconductor package according to another embodiment of the present invention.
Figure 8A:
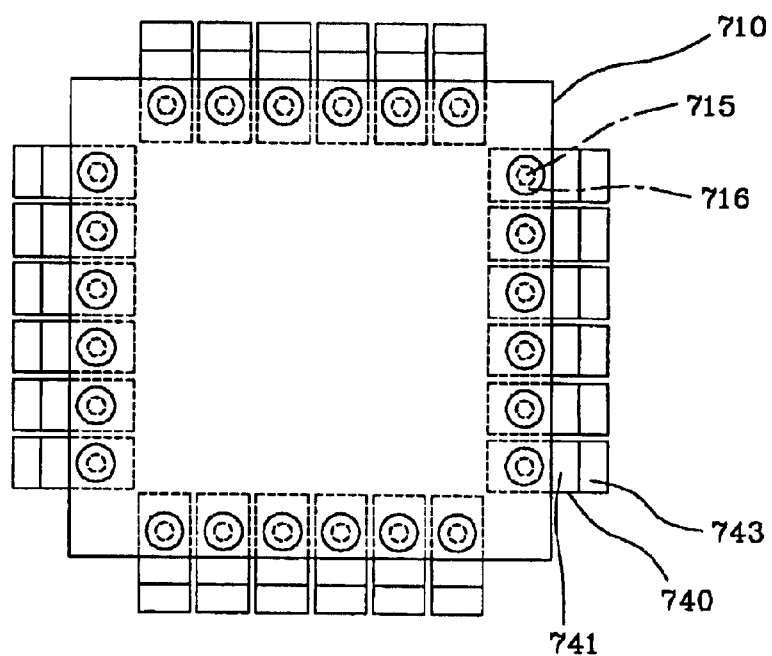
FIG. 8A is a plan view illustrating connection between the semiconductor die of FIG. 8 and a substrate.

Referring to FIGS. 8 and 8A, a semiconductor package 700 according to another embodiment of the present invention is illustrated.

First, a semiconductor die 710 including substantially planar first and second surfaces 711 and 712, a light receiving surface 714 formed at the center of first surface 711, and a plurality of bond pads (not shown) formed on the periphery of the light receiving surface 714, is provided.

A die via hole 715, which passes through first and second surfaces 711 and 712, is formed in the bond pads, and a die conductive via 716 is formed in die via hole 715. Die conductive via 716 extends from the periphery of the entrance of die via hole 715 to the outside of die 710, thereby improving the electrical connection between the die conductive via 716 and leads 740, as described below. First and second surfaces 711 and 712 the semiconductor die 710 are electrically connected to each other via the die conductive via 716.

A plurality of leads 740 having substantially planar first and second surfaces 741 and 742, are located in a region extending from second surface 712 to the periphery of semiconductor die 710. Leads 740 include a third surface 743 having a height which is greater than that of second surface 742 and is further formed at a region corresponding to the periphery of semiconductor die 710. The thickness between second surface 742 and third surface 743 is greater than that between first surface 741 and second surface 742. Also, the thickness between first surface 741 and third surface 743 is substantially equal to the thickness of semiconductor die 710 between first surface 711 and second surface 712.

The first surface 741 of leads 740 and die conductive via 716 are connected to each other by a conductive connector 778, and thereby leads 740 and semiconductor die 710 are mechanically and electrically connected to each other. The material of conductive connector 778 may be any one of conductive adhesives, gold (Au), silver (Ag) or an equivalent.

A glass 750 is attached to third surface 743 of leads 740 and first surface 711 of semiconductor die 710 by means of die attach material 771 and 772 which may be epoxy, adhesive or an equivalent, in order that glass 750 may transmit light. Further, semiconductor die 710 is encapsulated by encapsulant 760 in order to protect it from the external environment. Encapsulant 760 does not penetrate to the light receiving surface 714 owing to die attach material 772 bonded to first surface 711 of semiconductor die 710. Second surface 742 of leads 740 is exposed to the outside of encapsulant 760, so that leads 740 can be easily connected to an external device.

In semiconductor package 700, a light signal corresponding to an image, passes through glass 750 and is converted into an electrical signal by means of semiconductor die 710. The converted electrical signal is transmitted to an external device through die conductive vias 716, conductive connector 778, and first and second surfaces 741 and 742 of leads 740.

The present invention thereby provides a thin and small semiconductor package 700 by mounting the semiconductor die 710, in which conductive via 716 is formed within die via hole 715, on first surface 741 having a thickness that is thinner than that of leads 740.

A method for fabricating semiconductor packages 700 according to further embodiments of the present invention as described above will be described hereinafter.

First, leads 740, including substantially planar first and second surfaces 741 and 742 and third surface 743 having a height higher than that of first surface 741, are provided. Then, semiconductor die 10, including substantially planar first and second surfaces 711 and 712, light receiving surface 714 formed at the center of first surface 711, and bond pads formed on the periphery of light receiving surface 714, is provided. Die via holes 715, which pass through first and second surfaces 711 and 712, are formed in the bond pads, and die conductive vias 716 are formed within die via holes 15. Here, conductive connector 778 is formed on die conductive via 716 or first surface 741 of leads 740. Die conductive via 716 and the first surface 741 of leads 740 are connected to each other by means of conductive connector 778.

Next, second surface 712 of semiconductor die 710 is mounted on first surface 741 of leads 740 and thereby electrical signals of semiconductor die 710 are transmitted to leads 740. Finally, glass 750 is attached to the edge of first surface 711 of semiconductor die 710 and third surface 743 of leads 740 by means of die attach material 771 and 772 having a predetermined thickness. Semiconductor die 710 is encapsulated by the encapsulant 760 in order to protect it from the external environment. Second surface 742 of leads 740 is exposed to the outside of encapsulant 760, so that the second surface 742 of leads 740 can be easily connected to an external device.

Figure 9:
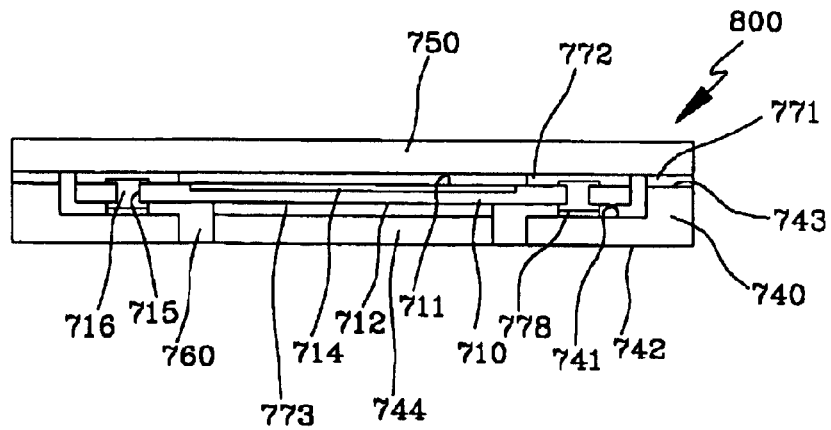
FIG. 9 is a sectional view illustrating a semiconductor package according to another embodiment of the present invention.

In another embodiment, a semiconductor package 800, as shown in FIG. 9 is illustrated. A die paddle 744 is attached to semiconductor die 710 by means of a die attach material 773 such as adhesive, epoxy or equivalents. Here, die paddle 744 is a substantially planar plate having a breadth that is smaller than that of the semiconductor die 710, and does not contact leads 740. The thickness of die paddle 744 is substantially the same as that that of the leads 740 between first surface 741 and second surface 742. In addition, the bottom surface of die paddle 744 is flush with second surface 742 of the leads 740 and exposed to the outside of encapsulant 760. Thereby, heat generated from semiconductor die 710 is easily emitted to the outside through die paddle 744.

Figure 10:
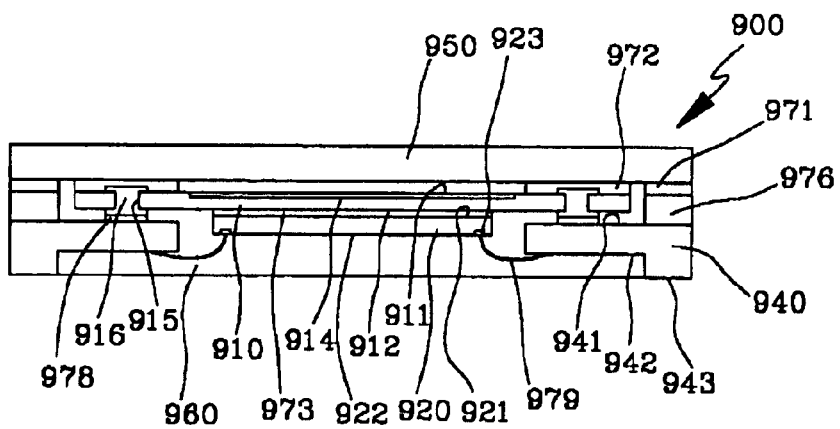
FIG. 10 is a sectional view illustrating a semiconductor package according to another embodiment of the present invention.
Figure 10A:
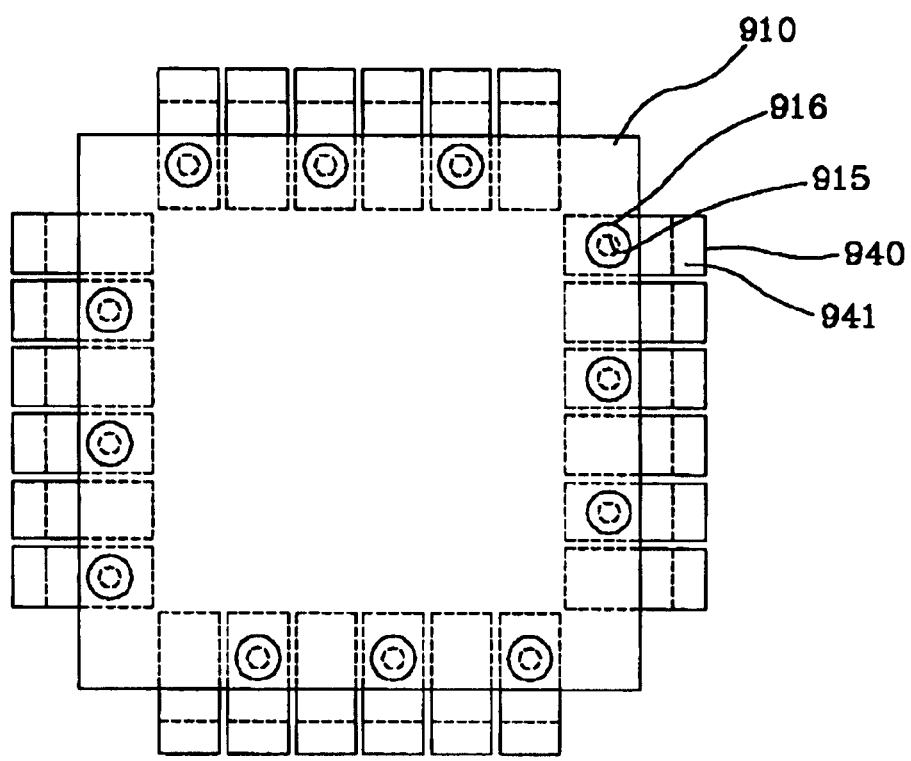
FIG. 10A is a plan view illustrating connection between the semiconductor die of FIG. 10 and a substrate.
Figure 10B:
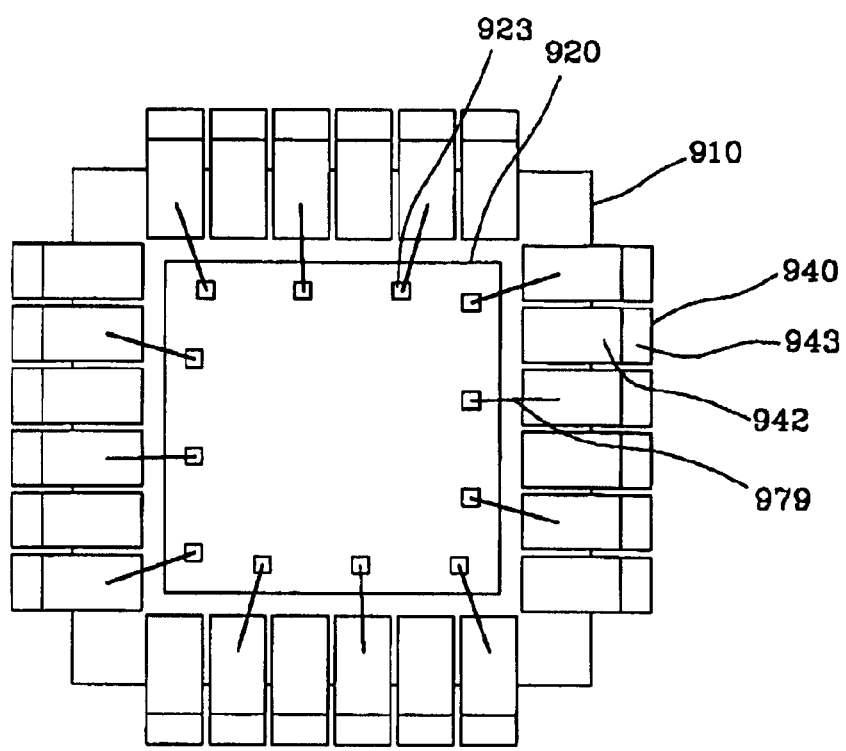
FIG. 10B is a bottom view illustrating connection between the semiconductor die of FIG. 10 and a substrate.

Referring to FIGS. 10, 10A and 10B, a semiconductor package 900 according to another embodiment of the present invention is illustrated.

First, a first semiconductor die 910 including substantially planar first and second surfaces 911 and 912, a light receiving surface 914 formed at the center of first surface 911, and a plurality of bond pads (not shown) formed on the periphery of the light receiving surface 914, is provided.

A die via hole 915, which passes through first and second surfaces 911 and 912 of first semiconductor die 910, is formed through the bond pads and a die conductive via 916 is formed within the die via hole 915. Die conductive via 916 is formed inside the die via hole 915 by applying a conductive metal such as aluminum, copper, gold, or silver. In an alternative embodiment, the walls of the die via hole 915 can be plated.

The die conductive via 916 can overflow the die via hole 915, on to first and second surfaces 911 and 912, thus forming segments or protrusions that extend beyond the circumference of the die via hole 915 onto first and second surfaces 911 and 912. Such overflow of the die conductive via 916 may improve the electrical connection between die conductive via 916 and leads 940 as described below.

A plurality of leads 940 having substantially planar first and second surfaces 941 and 942, are located at a region extending from second surface 912 to the periphery of first semiconductor die 910. Leads 940 include a third surface 943 having a height which is lower than that of second surface 942 and are formed at a region corresponding to a lower part of the periphery of semiconductor die 910. Third surface 943 protrudes downward from second surface 912 and the thickness between first surface 941 and third surface 943 is greater than the thickness between first surface 941 and second surface 942.

A second semiconductor die 920 is attached to second surface 912 of first semiconductor die 910. Second semiconductor die 920 includes substantially planar first and second surfaces 921 and 922 and a plurality of bond pads 923 formed on second surface 922. Second semiconductor die 920 is attached to second surface 912 of first semiconductor die 910 by means of a die attach material 973 such as adhesive, epoxy or its equivalents. The breadth of semiconductor die 920 should be constructed in such manner so that second semiconductor die 920 is located between leads 940.

In an alternative embodiment, the second semiconductor die 920 has usual memory or IPN (Integrated Passive Network) functions, unlike first semiconductor die 910. In the semiconductor package 900 according to the present embodiment, first semiconductor die 910 having a solid state image sensing function and second semiconductor die 920 having another function are stacked upon each other, resulting in a multi-function of the semiconductor package.

Die conductive via 916 of first semiconductor die 910 is electrically and mechanically connected to first surface 941 of leads 940 by means of a conductive connector 978. Also, bond pads 923 of second semiconductor die 910 are electrically and mechanically connected to second surface 942 of leads 940 by means of conductive wires 979.

Since the first and second semiconductor dice 910 and 920 perform different functions from each other, the first and second semiconductor dice 910 and 920 must not both be electrically connected to a particular lead 940. That is, leads 940 connected to first semiconductor die 910 by conductive connector 978 and other leads 940 connected to second semiconductor die by another conductive wire 979 are repeated by turns in order that first and second semiconductor dice 910 and 920 are not both electrically connected to a particular lead 940.

A glass 950 is attached along the edge of first surface 911 of first semiconductor die 910 by means of an attach material 972 such as adhesive, epoxy or equivalents, in order to transmit light. An insulating support member 976 having a predetermined height is formed on the edge of first surface 941 of leads 940 in order to firmly attach glass 950. Glass 950 can be connected with first semiconductor die 910 and insulating support member 976 at the same time by applying an attach material 971 such as adhesive, epoxy or equivalent on insulating support member 976. It is preferred that the thickness of the insulating support member 976 be substantially similar to that of first semiconductor die 10.

First and second semiconductor dice 910 and 920, and conductive wire 979 are encapsulated by an encapsulant 960 in order to protect them from the external environment. Since attach material 972 is applied along the edge of first surface 911 of first semiconductor die 910, encapsulant 960 does not penetrate to light receiving surface 914. Third surface 943 of leads 940 is exposed to the outside of encapsulant 960, so that leads 940 can be easily connected to an external device.

In semiconductor package 900, an image represented by a light signal passes through the glass 950 and changes into an electrical signal by means of first semiconductor die 910. The converted electrical signal is transmitted to an external device through die conductive via 916, conductive connector 978, and first and third surfaces 941 and 943 of leads 940. Also, signals of second semiconductor die 920 are transmitted to an external device through leads 940 connected via conductive wire 979.

A method for fabricating semiconductor package 900 according to further embodiments of the present invention as described above will now be described. First, the plurality of leads 940 including first and second surfaces 941 and 942 and the third surface 943 downwardly protruding from second surface 942 is provided. Leads 940 are formed symmetrically in a cross section. In an alternative embodiment, conductive connector 978 can be formed on first surface 941 of leads 940 in advance.

Next, first semiconductor die 910 having first and second surfaces 911 and 912 and light receiving surface 914 formed on first surface 911, and a plurality of bond pads formed on the periphery of light receiving surface 914, is provided. Die via hole 915, which passes through first and second surfaces 911 and 912 is formed in the bond pads, and die conductive via 916 is formed within die via hole 915.

Second surface 912 of first semiconductor die 910 is mounted on first surface 941 of leads 940. Die conductive via 916 of first semiconductor die 910 is electrically connected to leads 940 via conductive connector 978.

In succession, second semiconductor die 920 including first and second surfaces 921 and 922, and a plurality of bond pads 923 formed on second surface 922, is provided. Second surface 921 of second semiconductor die 920 is attached to second surface 912 of first semiconductor die 910 by means of die attach material 973. Second surface 942 of leads 940 is electrically connected to bond pads 923 of second semiconductor die 920 by means of conductive wire 979. At this time, the bond pads of first semiconductor die 910 are connected leads 940 by means of conductive connector 978 and bond pads 923 of second semiconductor die 920 are connected to the leads 940 by means of conductive wire 979.

Glass 950 is attached to the edge of first surface 911 of first semiconductor die 910 by means of attach material 972 having a predetermined thickness, after electrically connecting second semiconductor die 920. Insulating support member 976 is formed on the edge of first surface 941 of leads 940 and glass 950 is attached by applying attach material 971 on the surface of insulating support member 976, so that the bonding strength with glass 950 is improved.

In an alternative method, after first and second dice 910 and 920 are attached to each other by die attach material 973, first semiconductor die 910 can be connected to one lead 940 by means of the conductive connector 978 and the second semiconductor die 920 can be connected to another lead 940 by means of the conductive wire 979. Next, glass 950 is attached to the surface of insulating support member 976 and the edge of first surface 911 of first semiconductor die 910 by means of attach material 971 and 972.

Then, first and second semiconductor dice 910 and 920, and conductive wire 979, etc. are encapsulated by the encapsulant 960 in order to protect them from the external environment.

Figure 11:
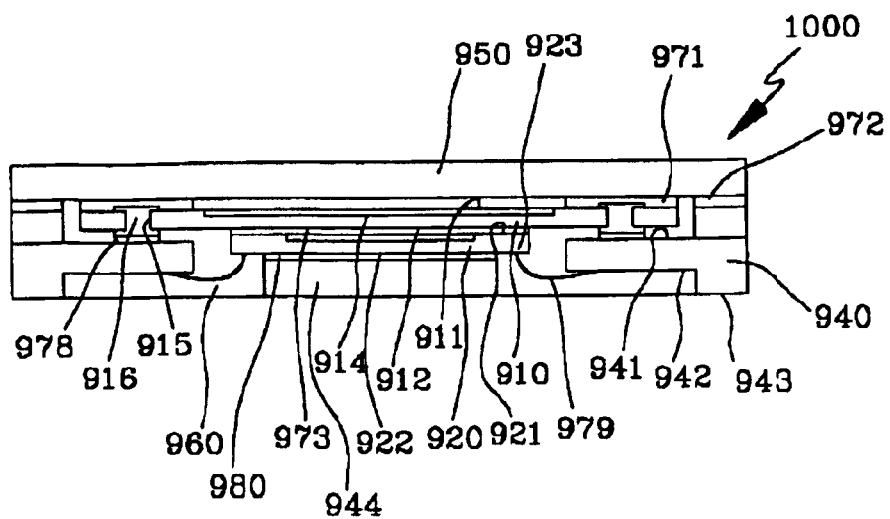
FIG. 11 is a sectional view illustrating a semiconductor package according to another embodiment of the present invention.

In another embodiment, in a semiconductor package 1000 as shown in FIG. 11, a die paddle 944 can be further attached to second semiconductor die 920 by means of a die attach material 980 such as adhesive, epoxy or its equivalent.

Die paddle 944 is a substantially planar plate having a breadth that is smaller than that of second semiconductor die 920 and does not make any contact with the leads 940. Die paddle 944 is located at the inside of bond pads 923 of second semiconductor die 920, lest die paddle 944 and the conductive wire 979 disturb each other.

The thickness of die paddle 944 is substantially the same as that of leads 940 between first surface 941 and second surface 942. In addition, the bottom surface of die paddle 944 is flushed with second surface 942 of leads 940 and exposed to the outside of encapsulant 960. Thereby, heat generated within semiconductor die 910 can be easily emitted to the outside through die paddle 944.

In an alternative embodiment, first semiconductor die 910 is a solid state image sensing device and is mounted on leads 940, which are not a limitation of the present invention. In alternative embodiments, a printed circuit board, circuit tape or circuit film or the like can be used instead of the leads.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package comprising:
    a semiconductor die having a substantially planar light receiving surface for receiving light from outside of the package, and a substantially planar opposing surface, wherein a plurality of bond pads are disposed on the periphery of the light receiving surface;
    a plurality of conductive bumps fused to the bond pads;
    a transparent substrate having a substantially planar first surface and a substantially planar second surface, wherein a plurality of electrically conductive patterns are formed near the circumference of the second surface, each of the conductive patterns having a first contact in electrical contact with an associated one of the conductive bumps, wherein the transparent substrate further includes channels formed between the second surface thereof and an end thereof, and wherein the conductive patterns are formed in the channels; and a plurality of conductive balls having a diameter greater than a height of the semiconductor die, wherein the conductive balls are each fused to a second contact of an associated one of the electrically conductive patterns.

2. The semiconductor package of claim 1, wherein the conductive patterns are patterns etched from a conductive layer deposited on the second surface of the glass.

3. The semiconductor package of claim 1, wherein the channels are etched channels formed in the transparent substrate.

4. The semiconductor package of claim 1, wherein the channels are engraved channels formed in the transparent substrate.

5. The semiconductor package of claim 1, further comprising an underfill applied around the conductive bumps at the periphery of the semiconductor die and between the semiconductor die and the transparent substrate, whereby extraneous material is prevented from reaching the light receiving surface.

6. The semiconductor package of claim 1, further comprising a cover coat applied over the electrically conductive patterns exclusive of the first contact and the second contact of each electrically conductive pattern.

7. The semiconductor package of claim 1, wherein the electrically conductive patterns are coated metal patterns.

8. The semiconductor package of claim 1, wherein the electrically conductive patterns are sputtered metal patterns.

9. The semiconductor package of claim 1, wherein the electrically conductive patterns are vapor deposited metal patterns.

10. The semiconductor package of claim 1, wherein the electrically conductive patterns are copper.

11. The semiconductor package of claim 1, wherein the electrically conductive patterns are aluminum.

12. The semiconductor package of claim 1, further comprising means for covering the electrically conductive patterns exclusive of the first contact and the second contact of each electrically conductive pattern.

13. A semiconductor package comprising:

a semiconductor die having means for receiving light from outside of the package, and a substantially planar surface opposite the means, wherein a plurality of bond pads are disposed on the periphery of the means;

a plurality of conductive bumps coupled to the bond pads; and a transparent substrate having a substantially planar first surface and a substantially planar second surface, wherein a plurality of electrically conductive patterns are fanned near the circumference of the second surface, each of the conductive patterns having a first contact in electrical contact with an associated one of the conductive bumps, wherein the transparent substrate further includes channels formed between the second surface thereof and an end thereof, and wherein the conductive patterns are formed in the channels.

14. The semiconductor package of claim 13, further comprising a plurality of conductive balls having a diameter greater than a height of the semiconductor die, wherein the conductive balls are each fused to a second contact of an associated one of the electrically conductive patterns.

15. The semiconductor package of claim 13, wherein the channels are etched channels formed in the transparent substrate.

16. The semiconductor package of claim 13, wherein the channels are engraved channels formed in the transparent substrate.

17. The semiconductor package of claim 13, further comprising an underfill applied around the conductive bumps at the periphery of the semiconductor die and between the semiconductor die and the transparent substrate, whereby extraneous material is prevented from reaching the light receiving surface.

18. The semiconductor package of claim 13, further comprising a cover coat applied over the electrically conductive patterns exclusive of the first contact and the second contact of each electrically conductive pattern.

* * * * *